(12) United States Patent
Meyer, IV et al.

(10) Patent No.: US 7,684,187 B1
(45) Date of Patent: Mar. 23, 2010

(54) HEAT DISSIPATION DEVICE

(75) Inventors: George Anthony Meyer, IV, San Jose, CA (US); Chien-Hung Sun, Zhongli (TW)

(73) Assignee: Celsia Technologies Taiwan, Inc., Taoyuan (TW)

( * ) Notice: Subject to any disclaimer, the term of this patent is extended or adjusted under 35 U.S.C. 154(b) by 0 days.

(21) Appl. No.: 12/211,957

(22) Filed: Sep. 17, 2008

(51) Int. Cl.
*H05K 7/20* (2006.01)
*H01L 23/36* (2006.01)

(52) U.S. Cl. .......................... 361/679.47; 361/679.52; 361/696; 361/700; 361/701; 165/80.3; 165/104.33; 165/121; 165/126

(58) Field of Classification Search .......... 361/679.46, 361/679.47, 679.52, 688, 689, 690–697, 361/700–717; 165/80.3, 104.21, 104.26, 165/104.33, 104.34, 185; 257/714–718, 257/722; 174/15.1, 15.2, 16.3, 252
See application file for complete search history.

(56) References Cited

U.S. PATENT DOCUMENTS

| | | | | |
|---|---|---|---|---|
| 5,924,481 A | * | 7/1999 | Tajima | 165/104.33 |
| 6,109,341 A | * | 8/2000 | Kodaira et al. | 165/80.3 |
| 6,834,712 B2 | * | 12/2004 | Parish et al. | 165/104.26 |
| 6,840,311 B2 | * | 1/2005 | Ghosh et al. | 165/104.33 |
| 6,913,070 B2 | * | 7/2005 | Wang et al. | 165/80.3 |
| 7,051,791 B2 | * | 5/2006 | Hashimoto et al. | 165/80.3 |
| 7,150,312 B2 | * | 12/2006 | Parish et al. | 165/104.21 |
| 7,277,285 B2 | * | 10/2007 | Shih et al. | 361/700 |
| 7,342,785 B2 | * | 3/2008 | Liu | 361/695 |
| 7,382,616 B2 | * | 6/2008 | Stefanoski | 361/698 |
| 7,458,415 B2 | * | 12/2008 | Hashimoto et al. | 165/80.3 |
| 7,497,249 B2 | * | 3/2009 | Bhatti et al. | 165/80.3 |
| 7,529,090 B2 | * | 5/2009 | Peng et al. | 361/700 |
| 7,583,502 B2 | * | 9/2009 | Tsao et al. | 361/697 |
| 2008/0266800 A1 | * | 10/2008 | Lankston et al. | 361/700 |

* cited by examiner

*Primary Examiner*—Michael V Datskovskiy
(74) *Attorney, Agent, or Firm*—Chun-Ming Shih

(57) ABSTRACT

A heat dissipation device includes a vapor chamber, a heat dissipating fins assembly, a cover and a fan. The vapor chamber is configured to a bent shape. The heat dissipating fins assembly is adhered to a partial surface of the vapor chamber. The cover is connected to the vapor camber. A flow passage is defined between the vapor chamber and the cover. The heat dissipating fins assembly is positioned in the flow passage. The cover defines an opening communicating to the flow passage. The fan is arranged facing to the opening of the cover and other partial surface of the vapor chamber. Therefore, the heat dissipating efficiency can be greatly improved.

8 Claims, 5 Drawing Sheets

HEAT DISSIPATION DEVICE

BACKGROUND

The present invention relates to a heat dissipation device, and particularly to a heat dissipation device with a bent vapor chamber.

With enhancement of the calculating capability of the central processing unit (CPU), the heat generates from the CPU is becoming greater than before. A conventional heat dissipation device composed of heat dissipating fins and a fan could not meet the heat dissipating requirement of the CPU. A vapor chamber with higher heat conducting efficiency is developed. The vapor chamber is combined with the heat dissipating fins to effectively resolve the heat dissipating problems. The vapor chamber could contact the heat generating electronic element in a large area directly, and these advantages could draw more development on the merit.

A conventional heat dissipation device includes a vapor chamber, a heat dissipating fins assembly and a fan. The vapor chamber is configured to a flat shape, and the vapor chamber is adhered to a surface of a heat generating element. The vapor chamber is also adhered to a surface of the heat dissipating fins assembly. The fan is attached to the heat dissipating fins assembly to dissipate heat from both the heat dissipating fins assembly and the vapor chamber. Therefore, heat from the heat generating element can be removed rapidly.

However, the conventional heat dissipation device has following disadvantage in practice use: when the fan dissipating heat from the heat dissipating fins assembly and the vapor chamber, the airflow can not be centralized effectively causing insufficient heat dissipation. Thus, the heat dissipating efficiency could be affected. Additionally, the vapor chamber is made in flat shape, however the outer surface thereof is adhered to the heat generating element completely, and further the heat conducting area is limited to the outer surface of the heat generating element. Thus, the heat dissipating efficiency can not be further improved efficiently. If the vapor chamber is broaden to enlarge the outer surface thereof, the other electronic elements on the circuit board may be intervened accordingly to cause the heat dissipation device not be appropriately installed and not be used therefore.

BRIEF SUMMARY

The present invention relates to a heat dissipation device, the heat dissipation device includes a cover covering on a heat dissipating fins assembly and a fan. The airflow from the fan can be centralized to dissipate heat from the heat dissipating fins assembly and a vapor chamber directly to enhance the efficiency of the heat dissipation.

The present invention relates to a heat dissipation device, the heat dissipation device includes a bent vapor chamber to enhance a heat conducting area thereof to enhance the efficiency of the heat dissipation.

The present invention relates to a heat dissipation device, the heat dissipation device includes a bent vapor chamber on opposite sides thereof to avoid interference with the other electronic elements of the mainboard to achieve a better applicability of installation.

The present invention relates to a heat dissipation device, the heat dissipation device includes a vapor chamber, a heat dissipating fins assembly, a cover and a fan. The vapor chamber is configured to a bent shape. The heat dissipating fins assembly is adhered to a partial surface of the vapor chamber. The cover is connected to the vapor camber. A flow passage is defined between the vapor chamber and the cover. The heat dissipating fins assembly is positioned in the flow passage. The cover defines an opening communicating to the flow passage. The fan is arranged facing to the opening of the cover and other partial surface of the vapor chamber.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
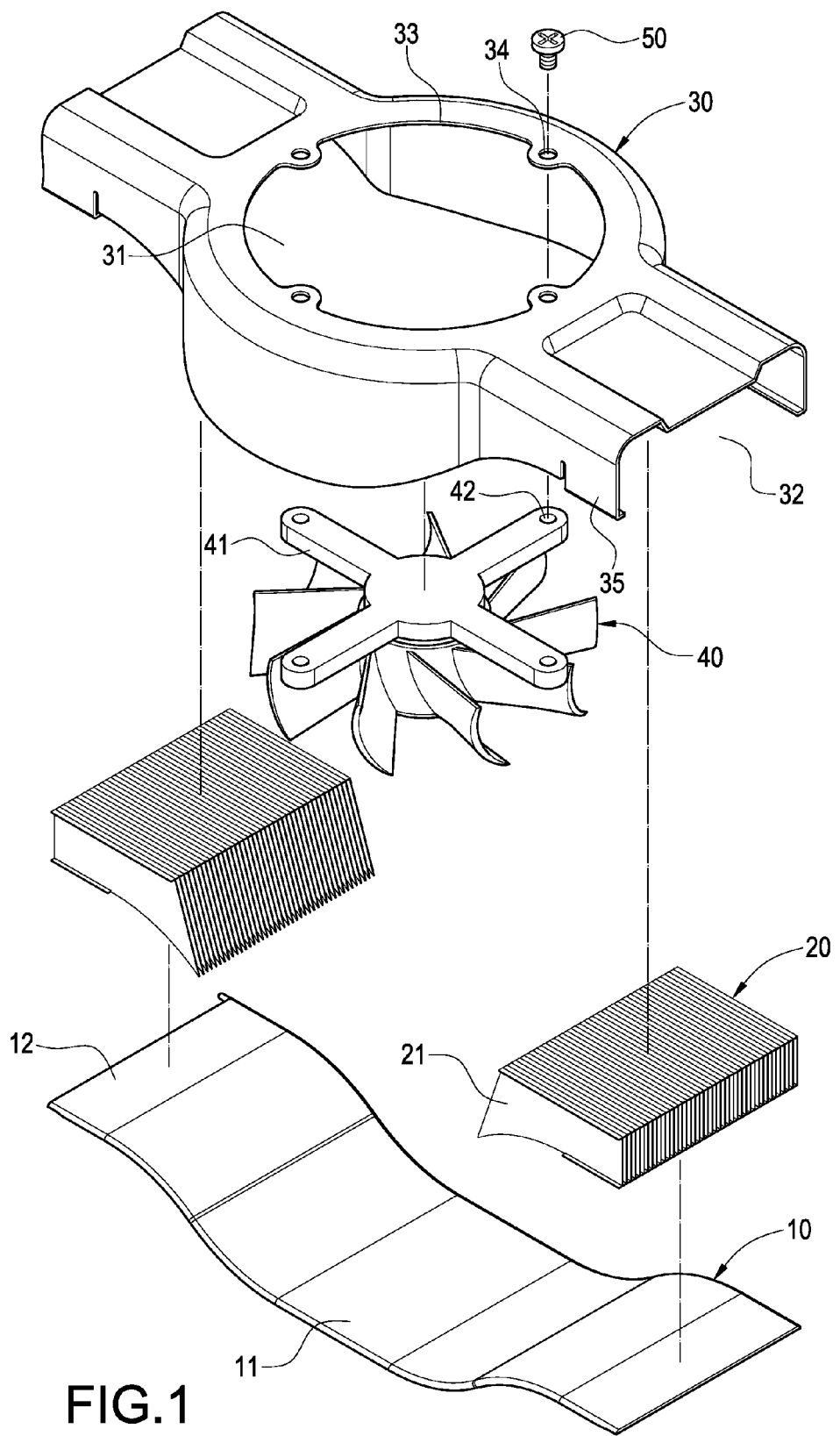
FIG. 1 is an isometric and exploded view of an exemplary embodiment of the present invention.
Figure 4:
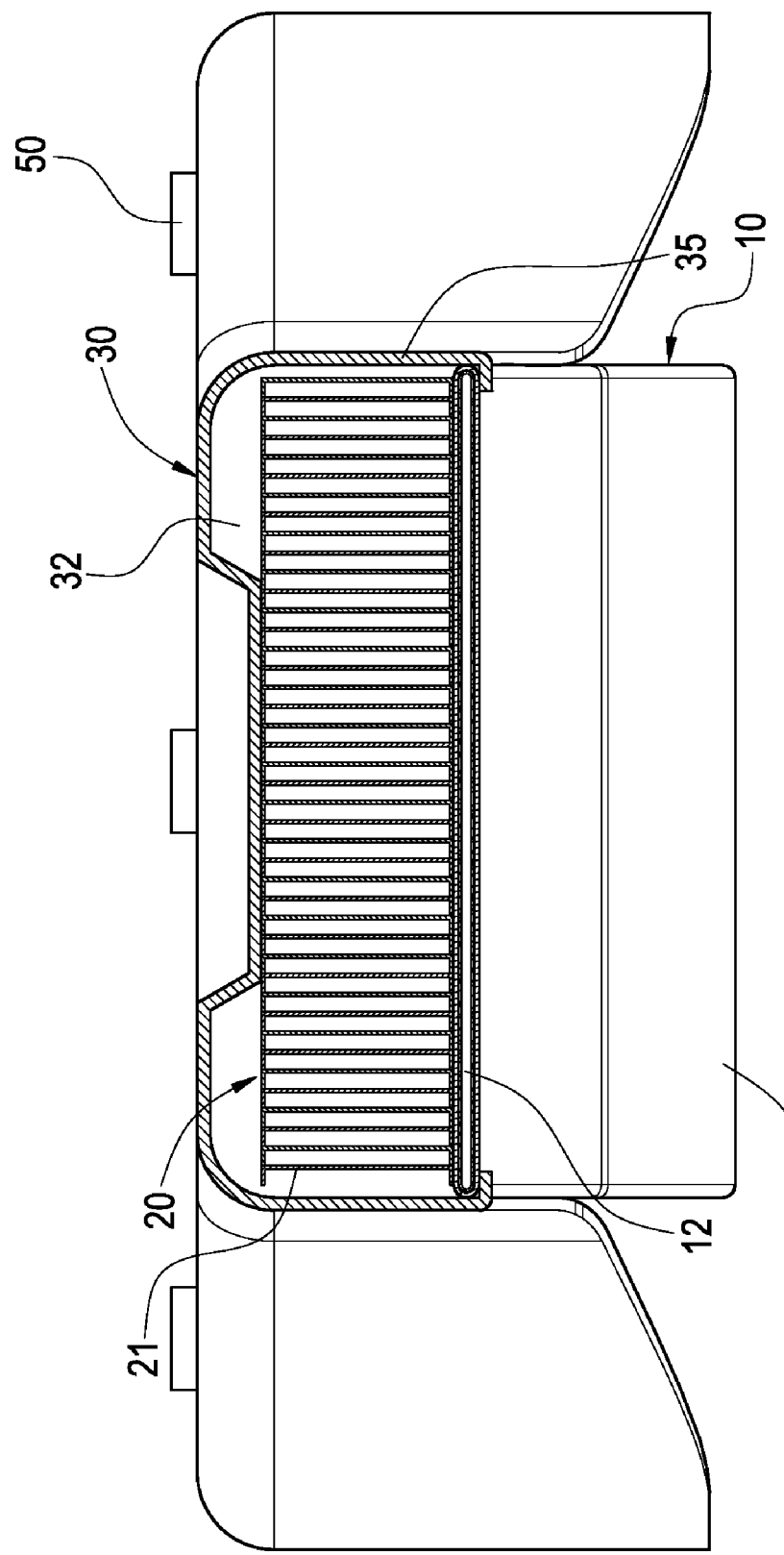
FIG. 4 is a sectional view from 4-4 of FIG. 3.

Referring to FIG. 1 and FIG. 4, a heat dissipation device of an exemplary of the present invention includes a vapor chamber 10, a heat dissipating fins assembly 20, a cover 30 and a fan 40.

Figure 5:
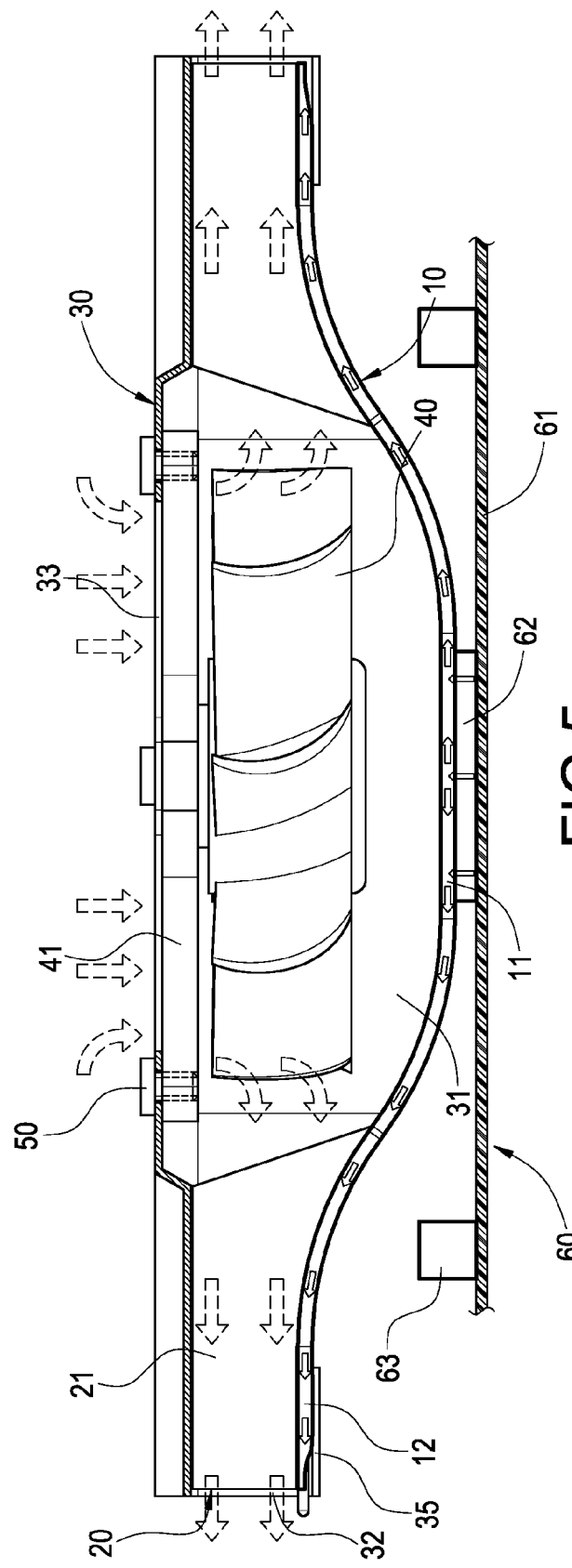
FIG. 5 is a practical application view of the exemplary embodiment of the present invention.

The vapor chamber 10 is made in a strip structure and is configured to a bent shape. The vapor chamber 10 includes a heat absorbing portion 11 and two heat emitting portion 12 deformedly extending from opposite sides of the absorbing portion 11. The absorbing portion 11 protrudes from the surface of the emitting portions 12. The absorbing portion 11 is adhered to a surface of a heat generating element 62 (as shown in FIG. 5). A large heat dissipating area is configured at the heat dissipating portion 12 and heat absorbing portion 11. The heat generating element 62 is a CPU, a semiconductor packing part, a wafer or other electronic elements with high heat generation.

The heat dissipating fins assembly 20 is adhered to a partial surface of the vapor chamber 10, preferrably, the heat dissipating fins 20 is adhered to the surface of the emitting portions 12 tightly. The heat dissipating fins assembly 20 is configured with a plurality of heat dissipating fins 21 aligned in regular space. The heat dissipating fins 21 are made from aluminum extrusion.

The cover 30 is attached to the vapor chamber 10. A flow passage 32 is defined between the cover 30 and the vapor chamber 10. The heat dissipating fins assembly 20 is positioned in the flow passage 32. An opening 33 is defined in the cover 30 in communication with the flow passage 32, and a receiving space 31 is defined within the cover 30 communicating with the opening 33. A plurality of through holes 34 communicating with the opening 33 is defined in the surface of the cover 30. The holes 34 are defined adjacent to the opening 33. A hook 35 is formed at each lateral side of the cover 30. The two hooks 35 are buckled to the two opposite sides of the heat emitting portion 12 of the vapor chamber 10.

The fan 40 is assembled within the receiving space 31, and facing to the opening 33 and a top surface of the vapor chamber 10. The fan 40 includes a bracket 41. A plurality of screw holes 42 is defined in the bracket 41 corresponding to the through holes 34. A screw 50 can be fastened through each screw hole 42 and the corresponding through hole 34. The fan 40 can be an axial fan or a centrifugal fan.

Figure 2:
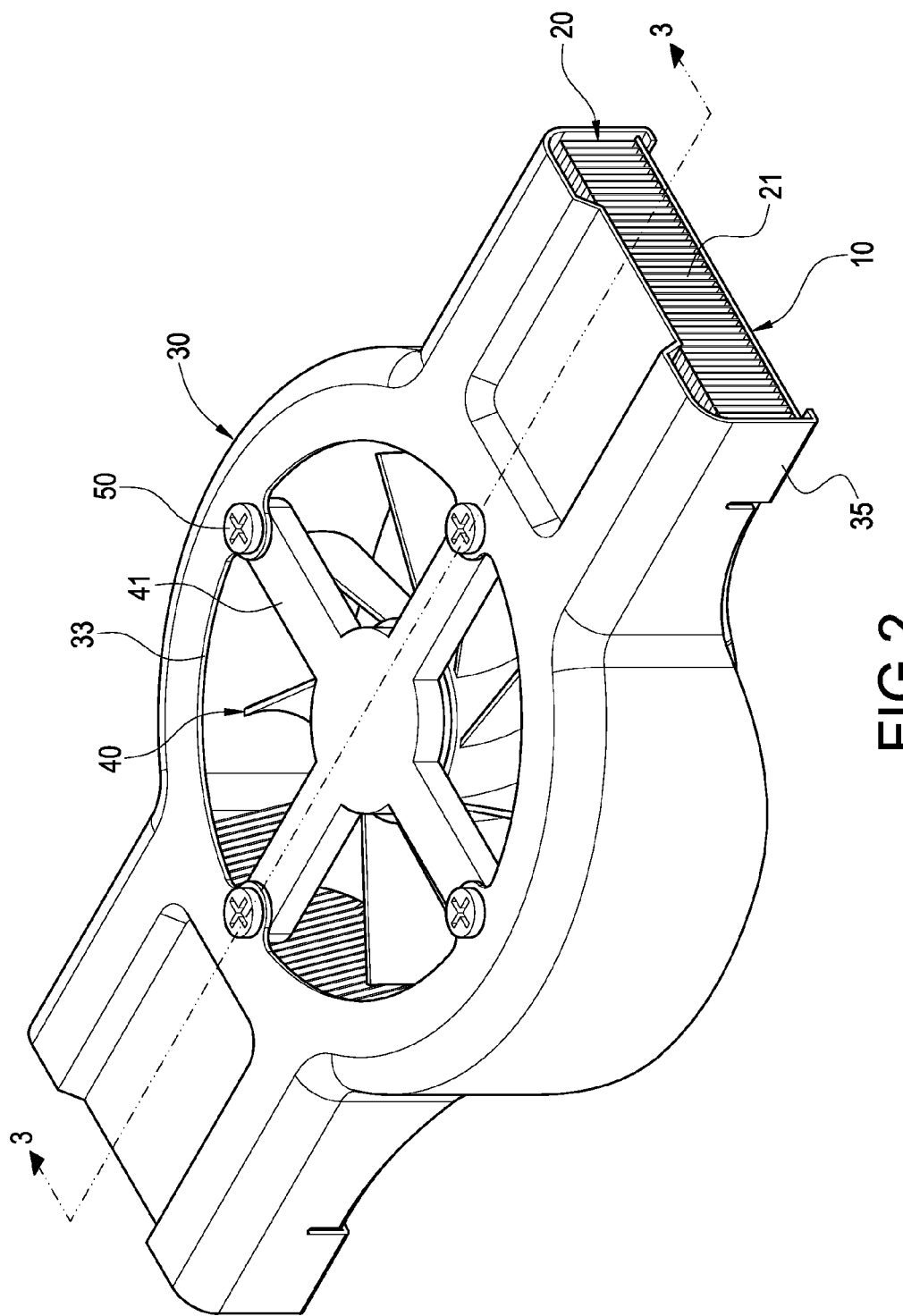
FIG. 2 is an isometric and assembled view of the exemplary embodiment of the present invention.
Figure 3:
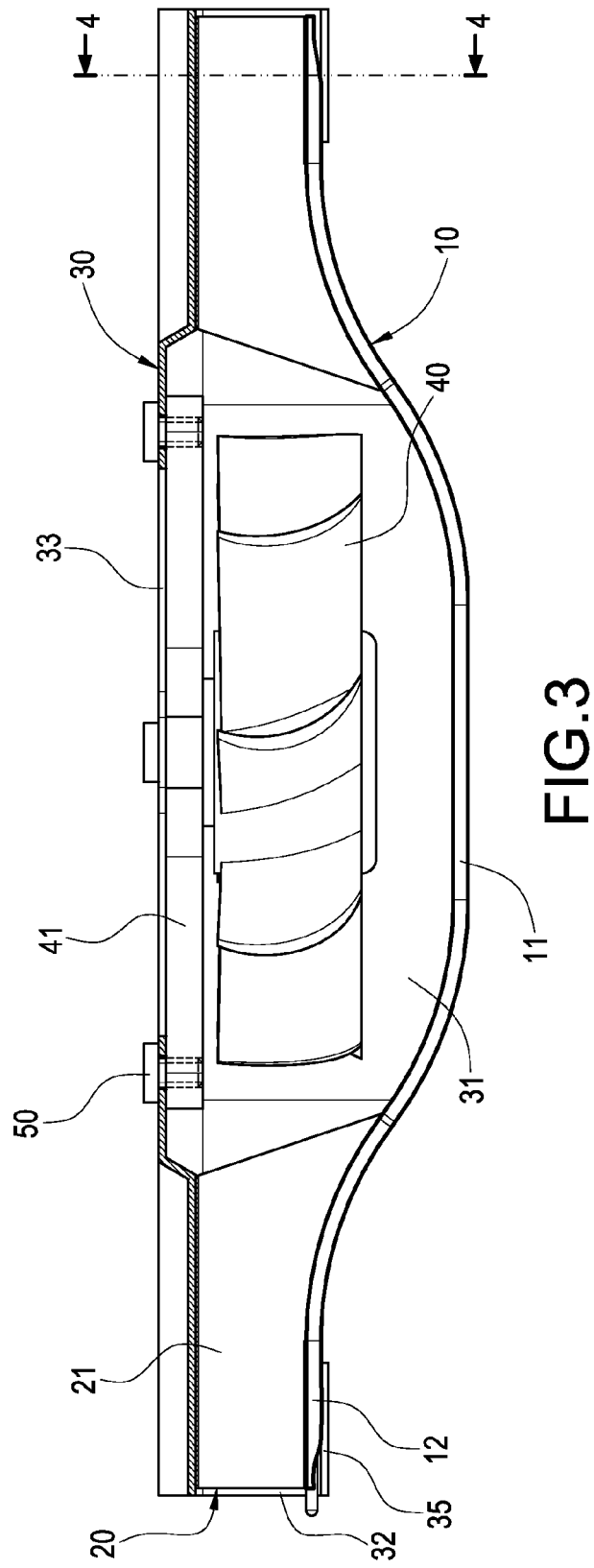
FIG. 3 is a sectional view from 3-3 of FIG. 2.

Referring to FIG. 1 and FIG. 2, when assembling the heat dissipation device, the heat dissipating fins assembly 20 is first attached to an outer surface of the emitting portion 12 of the vapor chamber 10. The heat dissipating fins assembly 20 can be fixed to the emitting portion 12 by welding. The fan 40 is then mounted in the receiving space 31 of the cover 30 by fastening the screws 50 to the screw holes 42 of the bracket 41 and the corresponding through holes 34 of the cover 30. Finally, the hooks 35 are buckled to the opposite sides of the heat emitting portion 12 of the vapor chamber 10 to assembling the cover 30 to the vapor chamber 10. The cover 30 can be fixed to the vapor chamber 10 by welding Referring also to FIG. 5, the heat dissipation device of the exemplary embodiment of the invention is used in an electronic product 60. The electronic product 60 includes a mainboard 61, a heat generating element 62 and a plurality of electronic elements 63. First, after the heat absorbing portion 11 is adhered to the surface of the heat generating element 62, heat from the heat generating element is conducted to the heat dissipating fins assembly 20 via the vapor chamber 10. Heat from the dissipating fins assembly 20 and the vapor chamber 10 can be dissipated by the fan 40 directly, thereby the heat can be rapidly brought away through the flow passage 32. The heat dissipating efficiently is therefore improved.

The heat emitting portions 12 extending from the heat absorbing portion 11 can enhance the conducting area of the vapor camber 10 to improve the heat dissipating efficiently.

The heat emitting portions 12 are higher than the heat absorbing portion 11. The heat emitting portions 12 can not only enhance the heat conducting area but also avoid interference with the electronic elements 63 of the mainboard 61. The heat dissipation device can be used in anyone of the heat generating elements 62 on the mainboard 61, regardless of the positions of electronic elements 63 around the heat generating element 62 which can lead to an incapable of the installation. Therefore, the heat dissipation device of the exemplary of the present invention has a better applicability of installation.

The heat dissipation device of the exemplary of the present invention may be used in the electronic product 60 with a thin thickness, such as notebook computers, personal digital assistants (PDAs), and so on.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A heat dissipation device, comprising
   a vapor chamber, configured to a bent shape;
   a heat dissipating fins assembly, adhered to a partial surface of the vapor chamber;
   a cover, connected to the vapor camber, a flow passage defined between the vapor chamber and the cover, the heat dissipating fins assembly positioned in the flow passage, and the cover defining an opening communicating to the flow passage; and
   a fan, arranged facing to the opening of the cover and a top surface of the vapor chamber,
   wherein a hook is formed at each lateral side of the cover, and the two hooks are buckled to the two opposite sides of the vapor chamber.

2. The heat dissipation device as claimed in claim 1, wherein the vapor chamber is made in a strip shape.

3. The heat dissipation device as claimed in claim 1, wherein the vapor chamber comprises a heat absorbing portion and two heat emitting portions deformedly extending from opposite sides of the heat absorbing portion.

4. The heat dissipation device as claimed in claim 3, wherein the heat emitting portion is adhered to the heat dissipating fins assembly.

5. The heat dissipation device as claimed in claim 1, wherein the heat dissipating fins are made by aluminum extrusion.

6. The heat dissipation device as claimed in claim 1, wherein a receiving space is defined in the cover communicating with the flow passage, and the fan is received in the receiving space.

7. The heat dissipation device as claimed in claim 1, wherein the fan comprises a bracket, a plurality of screw holes is defined in the bracket, a plurality of through holes is defined in the cover corresponding to the screw holes, and a screw is fastened through each screw hole and the corresponding through hole.

8. The heat dissipation device as claimed in claim 1, wherein the fan is an axial fan.

* * * * *